United States Patent [19]

Friedenreich et al.

[11] Patent Number: 5,756,404

[45] Date of Patent: May 26, 1998

[54] TWO-STEP NITRIDE DEPOSITION

[75] Inventors: John P. Friedenreich; Robert K. Carstensen, both of Boise, Id.

[73] Assignee: Micron Technologies, Inc.

[21] Appl. No.: 568,944

[22] Filed: Dec. 7, 1995

[51] Int. Cl.$^6$ .................................................. H01L 21/318
[52] U.S. Cl. .................................................. 438/791
[58] Field of Search .................................. 437/238, 241, 437/235, 919; 148/DIG. 114; 438/791

[56] References Cited

U.S. PATENT DOCUMENTS

| | | | |
|---|---|---|---|
| 4,402,997 | 9/1983 | Hogan et al. | 427/94 |
| 4,486,465 | 12/1984 | Nguygen | 427/85 |
| 5,478,765 | 12/1995 | Kwong et al. | 437/40 |

Primary Examiner—Charles L. Bowers, Jr.
Assistant Examiner—Thanh Nguyen
Attorney, Agent, or Firm—Reed Smith Shaw & McClay

[57] ABSTRACT

A method is provided for fabricating a nitride layer of the semiconductor integrated circuit on a semiconductor substrate in a processing chamber. Source gases are applied to the processing chamber and a first nitride layer is deposited over the semiconductor substrate according to the source gases. The source gases are discontinued and the processing chamber is pumped out. Source gases are again applied to the processing chamber and a second nitride layer is deposited upon the first nitride layer according to the applied source gases. The first and second nitride layers form a combined nitride layer. Four alternate embodiments are set forth. In the first embodiment a predetermined amount of time is waited between the pumpout of the processing chamber and the deposition of the second nitride layer. The amount of time can be approximately ten minutes. In the second embodiment, the processing chamber is purged with nitrogen gas prior to depositing the second nitride layer. The purge can extend for between two minutes and sixty minutes. In the third embodiment the processing chamber is purged with nitrous oxide prior to depositing the second nitride layer. In the fourth embodiment the processing chamber is purged with nitrous oxide and an oxide layer is formed upon the first nitride layer prior to depositing the second nitride layer. In each of the embodiments the first nitride layer can be between 20% and 80% of the total combined thickness of the first and second nitride layers.

17 Claims, 2 Drawing Sheets

TWO-STEP NITRIDE DEPOSITION

BACKGROUND OF THE INVENTION

1. Field of the Invention

This invention relates to the field of semiconductor integrated circuit fabrication and, in particular, to the fabrication of capacitors in small dynamic random access memory cells.

2. Background Art

The memory cells of dynamic random access memories (DRAM) include two major components: a field effect transistor (FET) and a capacitor. It is well known in the art of semiconductor fabrication to use planar capacitors within DRAM cells. However, in DRAM cells that included conventional planar capacitors more integrated circuit surface area was dedicated to the planar capacitor than to the FET. Planar capacitors of this type generally proved to be adequate for use in DRAM integrated circuits up to approximately the one megabit level. However, planar capacitors constructed with conventional dielectric materials were not usable for the small memory cell sizes required beyond the one megabit DRAM level.

As memory cell size and therefore capacitor size shrank, several problems increased with respect to the fabrication of cell capacitors. One problem, for example, was the rapid dissipation of the charge within the smaller memory cells. This resulted in "soft" errors. Another was the reduction of the sense amp differential signal. This degraded noise sensitivity and made it more difficult to provide appropriate signal selectivity. Additionally, as cell capacitance decreased, the cell refresh time generally shortened. Shorter refresh times required more frequent interruptions for refresh overhead.

Several methods for providing adequate cell capacitance in view of shrinking cell size have been developed in the prior art. One well known method involved the formation of trench capacitors in the cell substrate. Similar in concept to the planar capacitor, the trench capacitor included a trench that was used to provide greater electrode area, and hence, greater storage capacitance within memory cells. A lower electrode of a trench capacitor was formed from an n+ doped silicon substrate or from a polycrystalline silicon layer which lined a trench cut in an n+ doped silicon substrate. An upper electrode of the trench capacitor could be formed from a layer of conductively doped polycrystalline silicon. The lower and upper electrodes were electrically insulated from each other with a dielectric layer.

Another way to provide adequate cell capacitance in view of shrinking cell size was to provide a dielectric material having a higher dielectric constant. Using a capacitor dielectric material having a higher dielectric constant to form a dielectric layer provided a larger capacitance in the same surface area of a FET. For this reason capacitors within DRAM cells often used a silicon nitride film as a dielectric layer rather than a silicon dioxide film. The dielectric constant of silicon nitride film is one and one-half to two times larger than that of the thermally grown silicon dioxide film used in the storage capacitors of conventional memory cells. The greatly increased dielectric constant provided by silicon nitride permitted increased capacitance in a predetermined cell surface area. Moreover, the frequency dispersion of the silicon nitride film dielectric was very small. Accordingly, the use of silicon nitride film in the storage capacitors of the smaller memory cells was preferred over the use of silicon dioxide.

However, dielectric materials within capacitors must also have as small a leakage current as possible in order to form a lossless capacitor. Silicon nitride has less desirable leakage current properties than silicon dioxide. In particular, the leakage current through silicon nitride films is larger than the leakage current through silicon dioxide films that are thermally grown on a silicon substrate because the energy bandgap of a silicon nitride is more narrow. The energy bandgap of silicon nitride is 5 eV and the energy bandgap of silicon dioxide is 8 eV. It was determined that a thin oxide layer formed upon the surface of the silicon nitride reduced the leakage current of a silicon nitride film to an acceptable level.

Another structure for providing the storage, capacitance required in DRAM cells as the size of the cells shrank, in addition to the trench structures, and the higher dielectric constant material in the capacitors, was a stacked capacitor structure on the DRAM cell surface. The lower electrode of a stacked capacitor could be formed from a conductively doped n-type polycrystalline silicon layer that was in electrical contact with the silicon substrate in the region of the FET storage node junction. The upper electrode of the stacked capacitor was also formed from a conductively doped polycrystalline silicon layer.

The two polycrystalline silicon layers serving as the capacitor electrodes of the stacked capacitor were separated by a dielectric layer. The dielectric layer of the stacked capacitor could be about twenty angstroms to about two hundred angstroms. Silicon nitride was usually preferred when forming the dielectric in order to obtain greater capacitance with a predetermined thickness.

It is known in the prior art to form a nitride layer using two nitride depositions. For example, a first nitride deposition was performed at a temperature of, typically, 680° C., and at a pressure of, typically, 235 mtorr. A n anneal of the first nitride layer was performed and a second nitride deposition was performed over the first. The second nitride deposition was usually performed at approximately at the same temperature and pressure as the first. Alternating purges and pump downs were performed and an oxide layer was formed on the nitride layer by applying oxygen at a temperature of approximately 700° to 900° C. for about fifteen to thirty minutes.

An "Improved Resistance to Oxidation of Silicon Nitride b y In-Situ Annealing for the NO Capacitor Dielectric Film" by S. H. Kang, et al., Advanced Technology Center, Samsung Electronics Company, Ltd., San 24, Nongseo-Ri, Korea, Extended Abstracts of a 1993 International Conference on Solid State Devices and Materials, Makuhari, 1993, pp. 865–867, teaches a two-step nitride deposition process having an annealing step between the two deposition s. In the method taught by Kang, half of the thickness of a silicon nitride film was deposited and the source gases were turned off. The film was then annealed in nitrogen for a period of one or two hours, and the second deposition step was carried out. This method provided improved electrical characteristics of the nitride layer. However, the anneal step caused an increase in the thermal budget of the process.

It is therefore an object of the present invention to provide a semiconductor fabrication process for forming improved capacitors suitable for use in very small DRAM cells.

It is a further object of the present invention to provide an improved nitride dielectric within the capacitor of the DRAM cells.

It is a further object of the present invention to provide a nitride dielectric film having improved electrical characteristics without substantially increasing the thermal budget of the fabrication process.

These and other objects and advantages of the present invention will become more fully apparent from the description and claims which follow or may be learned by the practice of the invention.

SUMMARY OF THE INVENTION

A method is provided for fabricating a nitride layer of the semiconductor integrated circuit on a semiconductor substrate in a processing chamber. Source gases are applied to the processing chamber and a first nitride layer is deposited over the semiconductor substrate according to the source gases. The source gases are discontinued and the processing chamber is pumped out. Source gases are again applied to the processing chamber and a second nitride layer is deposited upon the first nitride layer according to the applied source gases. The first and second nitride layers form a combined nitride layer. Four alternate embodiments are set forth. In the first embodiment a predetermined amount of time is waited between the pumpout of the processing chamber and the deposition of the second nitride layer. The amount of time can be approximately ten minutes. In the second embodiment, the processing chamber is purged with nitrogen gas prior to depositing the second nitride layer. The purge can extend for between two minutes and sixty minutes. In the third embodiment the processing chamber is purged with nitrous oxide prior to depositing the second nitride layer. In the fourth embodiment the processing chamber is purged with nitrous oxide and an oxide layer is formed upon the first nitride layer prior to depositing the second nitride layer. In each of the embodiments the first nitride layer can be between 20% and 80% of the total combined thickness of the first and second nitride layers.

BRIEF DESCRIPTION OF THE DRAWINGS

In order that the manner in which the above recited and other advantages and objects of the invention are obtained can be appreciated, a more particular description of the invention briefly described above is rendered by reference to a specific embodiment thereof which is illustrated in the appended drawings. Understanding that these drawings depict only a typical embodiment of the invention and are therefore not to be considered limiting of its scope, the invention and the presently understood best mode thereof are described and explained with additional specificity and detail through the use of the accompanying drawings.

DETAILED DESCRIPTION OF THE INVENTION

Figure 1:
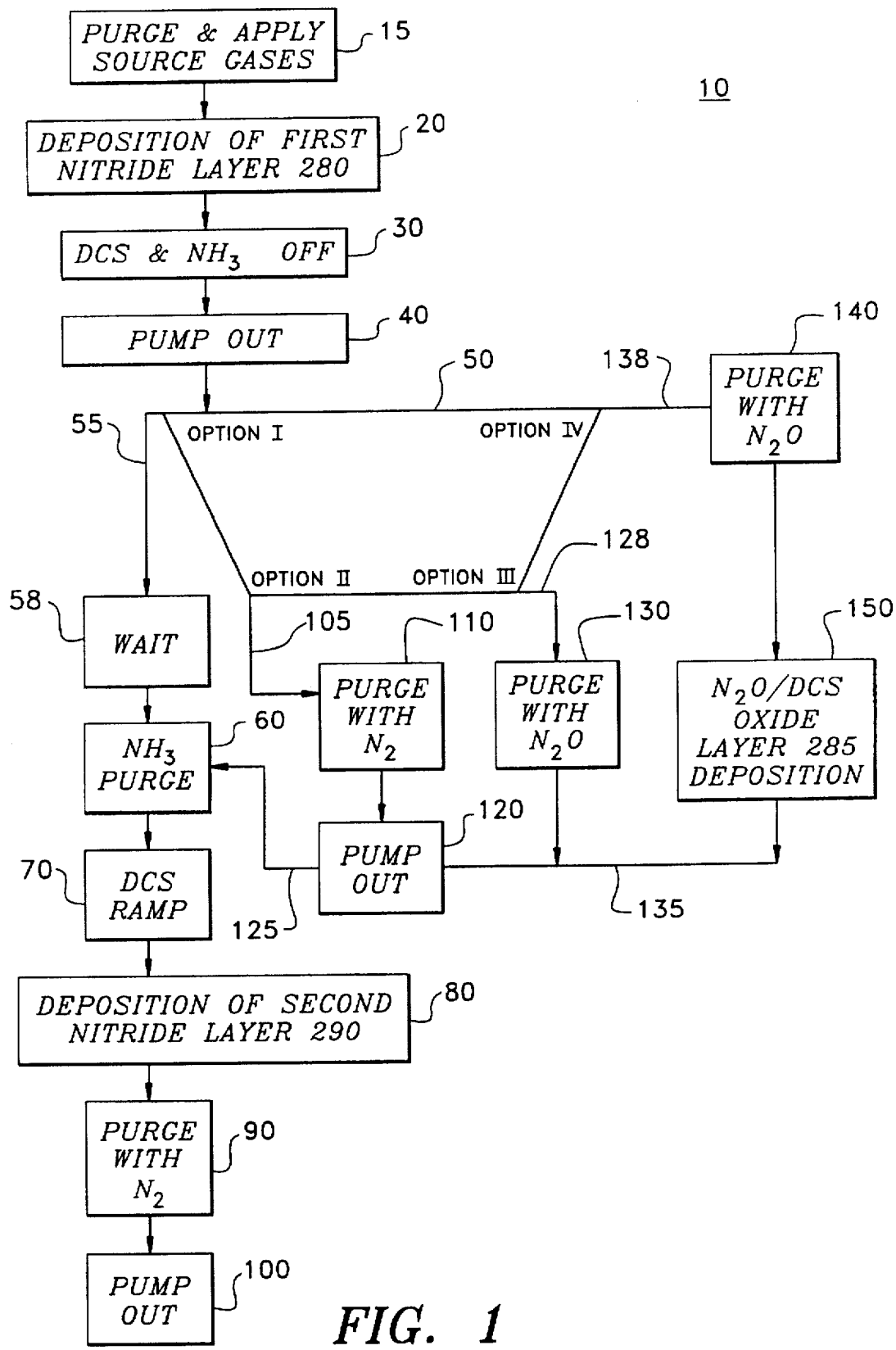
FIG. 1 shows a schematic process flow diagram of the two-step nitride deposition method of the present invention.

Referring now to FIG. 1, there is shown a flow chart representation of two-step silicon nitride deposition method 10 of the present invention. Two-step nitride deposition method 10 can be advantageously applied to form nitride dielectric layers within the capacitors of DRAM cells. However, it will be understood that two-step silicon nitride deposition method 10 can be applied to the depositing of any type of nitride layer known to those skilled in the art.

Figure 2:
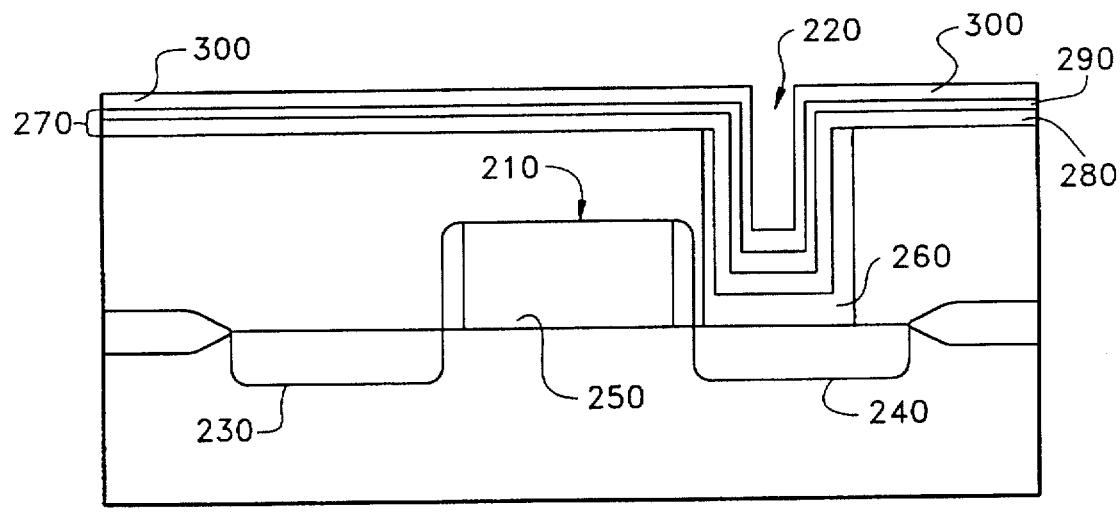
FIG. 2 shows a cross-sectional representation of a DRAM cell formed in accordance with the method of FIG. 1.

Referring now to FIG. 2, there is shown a cross-sectional representation of DRAM cell 200 formed in a conventional semiconductor fabrication chamber in accordance with two-step nitride deposition method 10 of the present invention. DRAM cell 200 includes a conventional transistor 210 and a stacked capacitor 220. Transistor 210 of DRAM cell 200, which can be a p-channel device or an n-channel device, includes drain 230, source 240 and gate 250. Capacitor 220 of DRAM memory cell 200 includes lower electrode 260, two-step nitride layer 270 and upper elect rode 300. Electrodes 260, 300 can be formed of conventional doped polysilicon. Two-step nitride layer 270 includes first nitride layer 280 and second nitride layer 290.

Nitride layers 280, 290 of two-step nitride layer 270 can be formed in accordance with two-step nitride deposition method 10 of the present invention. Two-step nitride layer 270 formed in this manner functions as a single conventional nitride layer, notwithstanding FIG. 2 which shows it as two separate nitride layers 280, 290 only for the purpose of illustration. A typical total thickness for two-step nitride layer 270 can be between approximately twenty angstroms and approximately two hundred angstroms. However, it will be understood that two-step nitride layer 270 can have any thickness typical of prior art nitride layers.

As shown in block 20 of two-step nitride deposition method 10, a deposition of first nitride layer 280 is performed using the source gases provided in block 15. It will be understood by those skilled in the art that any conventional method of depositing nitride can be used in performing the deposition step set forth in block 20. For example, the conventional nitride deposition of block 20 can be performed in a conventional processing chamber or fabrication chamber using source gases such as dichlorosilane (DCS) and ammonia. Furthermore, the nitride deposition of block 20 can be performed at any temperature and pressure effective to form a nitride layer. In one preferred embodiment of the invention, the nitride deposition of block 20 is performed at approximately 680° C., at a pressure of approximately 235 mtorr. The thickness of first nitride layer 280 deposited in this step can be anywhere from approximately twenty percent to approximately eighty percent of the total thickness of two-step nitride layer 270.

After the depositing of first nitride layer 280 is performed, as set forth in block 20, the sources of the DCS and ammonia used for forming layer 280 are turned off as shown in block 30 of nitride deposition method 20. The fabrication chamber is then pumped out in order to evacuate the gases as shown in block 40.

At least four alternate embodiments of two-step nitride deposition method 10 of the present invention can be performed after the pump out of block 40. As shown in four-way decision node 50, the four alternate embodiments of the present invention are designated option I, option II, option III and option IV.

When option I of two-step nitride deposition method 10 is performed, pathway 55 from decision node 50 is followed and a wait period is encountered as shown in block 58. During the wait period of block 58 the base pressure of the fabrication chamber is reestablished. The wait period of block 58 can be any amount of time. However, a wait period of approximately ten minutes has been determined to be satisfactory.

After the wait period of block 58, in order to perform the second nitride deposition, an ammonia purge can be performed. The ammonia purge of the deposition of second nitride layer 290 is shown in block 60. DCS can then be ramped, as shown in block 70 of nitride deposition method 10. When the fabrication chamber is purged and DCS is again flowing, the deposition of second nitride layer 290 can begin as shown in block 80. During the second nitride deposition, second nitride layer 290 is deposited upon first nitride layer 280. This deposition of second nitride layer 290 can be performed directly upon the surface of first nitride layer 280 without any annealing of first nitride layer 280 prior to the second deposition. In general, it is believed to be preferable to perform the deposition of second nitride layer 290 following substantially the same process steps as those performed to deposit first nitride layer 280. However, it will be understood by those skilled in the art that any conventional method of depositing second nitride layer 290 can be used.

The deposition of second nitride layer 290 can continue until the total required thickness of two-step nitride layer 270 is deposited. After the second nitride deposition of block 80 is complete, a conventional nitrogen purge and a pump out are performed as shown in blocks 90, 100.

If option II of two-step nitride deposition method 10 is performed, pathway 105 from decision node 50 is followed. In option II a purge of the fabrication chamber with nitrogen, shown by block 110, is performed after the deposition of first nitride layer 280. This purge can be performed at 680° C. and 235 mtorr. The duration of the nitrogen purge of block 110 can be any amount of time suitable for purging the fabrication chamber. However, a purge period of approximately two minutes to approximately sixty minutes is satisfactory. After the nitrogen purge of block 110, the fabrication chamber is pumped out as shown in block 120.

Second nitride layer 290 of two-step nitride layer 270 is the n deposited in option II. In order to deposit second nitride layer 290, the same nitride deposition as set forth in option I can be used. Therefore, blocks 60–100 of nitrogen deposition method 10 can be executed in option II by way of pathway 125. Thus it will be understood by those skilled in the art that option II differs from option I, basically, in that the nitrogen purge of block 110 is performed in addition to or rather than the wait period of block 58.

When option III of two-step nitride deposition method 10 is performed, pathway 128 from decision node So is followed. In option III, a purge of the fabrication chamber with nitrous oxide ($N_2O$) is performed after the deposition of first nitride layer 280 as shown in block 130. This purge can be performed at 650°–800° C. and 100–300 mtorr. The duration of the $N_2O$ purge of block 130 can be any amount of time suitable to substantially purge the fabrication chamber. It has been determined that a period of approximately sixty minutes is satisfactory.

After the $N_2O$ purge of block 130 in option III, a second nitride deposition is performed. The second nitride deposition forms second nitride layer 290 of two-step nitride layer 270 over first nitride layer 280. The deposition of second nitride layer 290 within option III can be performed using the same process used in the deposition of second nitride layer 290 in option I and option II. Thus, option III of nitride deposition method 10 can proceed by way of pathway 135 to the pump down of the fabrication chamber as shown in block 120. Following the pump down the nitride deposition steps of blocks 60–100 are performed.

Therefore, it will be understood that option III of two-step nitride deposition method 10 differs from option II, basically, in that a purge of the fabrication chamber with $N_2O$ is performed in option III, as set forth in block 130, rather than the purge with nitrogen performed in option II, as shown in block 110.

Figure 3:
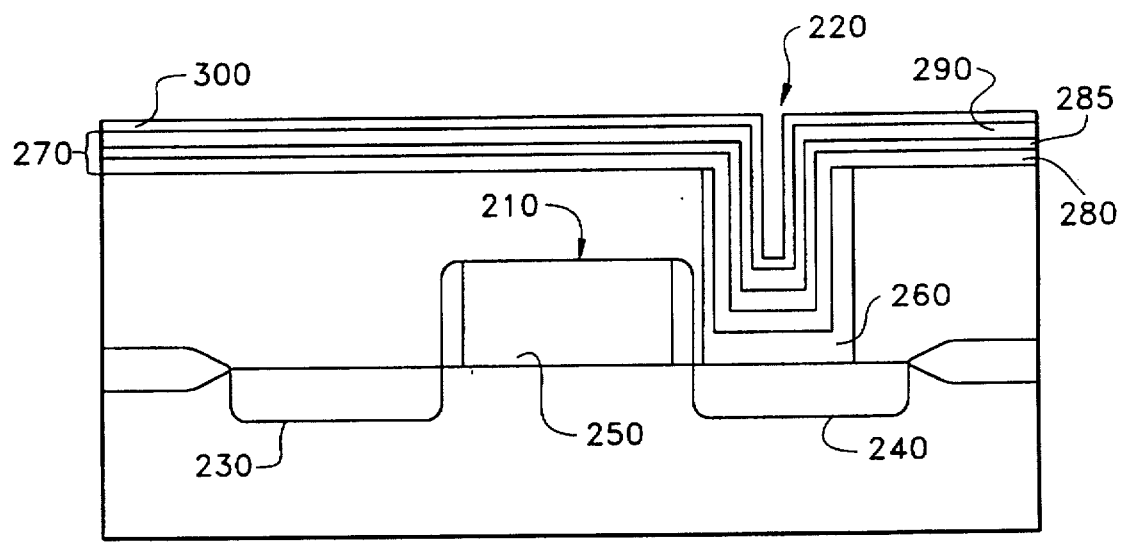
FIG. 3 shows a cross-sectional representation of a DRAM cell formed in accordance with an alternative embodiment of the method of FIG. 1.

Referring now to FIG. 3, there is shown a cross-sectional representation of DRAM cell 350 formed in a conventional semiconductor fabrication chamber in accordance with option IV of two-step nitride deposition method 10 of the present invention. When option IV of two-step nitride deposition method 10 is performed, after deposition of first nitride layer 280, pathway 138 from decision node 50 is followed. In option IV a purge of the fabrication chamber with $N_2O$ is performed, as shown in block 140 of nitride deposition method 10. The $N_2O$ purge of block 140 can be performed at a temperature of approximately 785° C. and a pressure of approximately 300 mtorr.

Oxide layer 285 can then be formed on the surface of first nitride layer 280 in option IV of two-step nitride deposition method 10 as shown in block 150. It can be formed by any chemical vapor deposition method. The presence of oxide layer 285 upon the surface of first nitride layer 280 improves the electrical characteristics of two-step nitride layer 270 formed in accordance with option IV. For example, two-step nitride layer 270 has improved leakage current for a predetermined dielectric thickness when oxide layer 285 is present. Oxide layer 285 on the surface of first nitride layer 280 can be formed using $N_2O$ and DCS. The formation of oxide layer 285 can take place at a temperature of approximately 700°–950° C. and a pressure of approximately 300 mtorr. The oxidation step can take between approximately fifteen to approximately thirty minutes.

After the formation of oxide layer 285 upon the surface of first nitride layer 280 in option IV of nitride deposition method 10, as set forth in block 150, second nitride layer 290 is deposited. In order to perform the deposition of second nitride layer 290 in option IV, steps 60–100 of two-step deposition method 10 can be performed by way of pathway 135 as previously described with respect to option II and option III. Thus option IV differs from option III, basically, in that the oxidation set forth in block 150 is performed after the $N_2O$ purge in option IV before forming second nitride layer 290.

It is to be understood that although the present invention has been described with reference to preferred embodiments, various modifications, known to those in the art, can be made to the structures and process steps presented herein.

We claim:

1. A method for fabricating a nitride layer of a semiconductor integrated circuit on a semiconductor substrate in a processing chamber, comprising the steps of:

(a) first applying source gases to said processing chamber;
   (b) depositing a first nitride layer over said semiconductor substrate according to said first applied source gases;
   (c) discontinuing said source gases;
   (d) pumping out said processing chamber;
   (e) second applying source gases to said processing chamber;
   (f) purging said processing chamber with nitrous oxide; and
   (g) depositing a second nitride layer upon said first nitride layer according to said second applied source gases to form a combined nitride layer after said purging.

2. The semiconductor fabrication method of claim 1, comprising the further step of waiting a predetermined period of time between step (d) and step (f).

3. The semiconductor fabrication method of claim 2, wherein said predetermined period of time comprises approximately ten minutes.

4. The semiconductor fabrication method of claim 2, comprising the further step of purging said processing chamber with ammonia.

5. The semiconductor fabrication method of claim 1, comprising the further step of purging said processing chamber with nitrogen prior to step (f).

6. The semiconductor fabrication method of claim 5, wherein said step of purging said chamber with nitrogen is performed for a period of time greater than two minutes.

7. The semiconductor fabrication method of claim 6, comprising the step of purging said chamber with nitrogen for a period of time less than sixty minutes.

8. The semiconductor fabrication method of claim 5, wherein said purging of said chamber with nitrogen is performed at approximately 650° to approximately 900° C. at a pressure of approximately 50 to approximately 300 mtorr.

9. The semiconductor fabrication method of claim 1, wherein said step of purging said chamber with nitrous oxide is performed at a temperature of approximately 680° C. and a pressure of approximately 250 mtorr.

10. The semiconductor fabrication method of claim 1, comprising the step of pumping out said chamber after purging said chamber with nitrous oxide.

11. The semiconductor fabrication method of claim 1, comprising the further step of forming an oxide layer upon said first nitride layer.

12. The semiconductor fabrication method of claim 11, wherein the step of forming said oxide layer comprises applying dichlorosilane and nitrous oxide to said chamber.

13. The semiconductor fabrication method of claim 1, wherein the thickness of said first nitride layer is greater than approximately twenty percent of the combined thicknesses of said first and second nitride layers.

14. The semiconductor fabrication method of claim 13, wherein the thickness of said first nitride layer is less than approximately eighty percent of the combined thicknesses of said first and second nitride layers.

15. The semiconductor fabrication method of claim 14, wherein said combined thickness is between approximately twenty angstroms and two hundred angstroms.

16. The semiconductor fabrication method of claim 1, comprising the further step of purging said processing chamber with nitrogen.

17. The semiconductor fabrication method of claim 15, comprising the step of pumping out said chamber after said purge with nitrogen.

* * * * *